(12) United States Patent
Yun et al.

(10) Patent No.: US 11,508,929 B2
(45) Date of Patent: Nov. 22, 2022

(54) CONDUCTOR AND METHOD OF MANUFACTURING THE SAME

(71) Applicant: SAMSUNG ELECTRONICS CO., LTD., Suwon-si (KR)

(72) Inventors: Dongjin Yun, Pohang-si (KR); Sunghoon Park, Seoul (KR); Seong Heon Kim, Seongnam-si (KR); Hyangsook Lee, Hwaseong-si (KR); Woon Jung Paek, Hwaseong-si (KR); Youngnam Kwon, Gunpo-si (KR); Yongsu Kim, Seongnam-si (KR); Jaegwan Chung, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 723 days.

(21) Appl. No.: 16/505,710

(22) Filed: Jul. 9, 2019

(65) Prior Publication Data
US 2019/0334110 A1      Oct. 31, 2019

Related U.S. Application Data

(62) Division of application No. 14/788,780, filed on Jun. 30, 2015, now abandoned.

(30) Foreign Application Priority Data

Feb. 3, 2015   (KR) .................. 10-2015-0016716

(51) Int. Cl.
*H01L 23/52*   (2006.01)
*H01L 51/52*   (2006.01)
(Continued)

(52) U.S. Cl.
CPC ......... *H01L 51/5206* (2013.01); *B05D 3/007* (2013.01); *H01B 1/22* (2013.01);
(Continued)

(58) Field of Classification Search
CPC ................. B05D 3/007; H01B 1/22
See application file for complete search history.

(56) References Cited

U.S. PATENT DOCUMENTS 5,459,326 A   10/1995   Yamada
5,814,194 A   9/1998   Deguchi et al.
(Continued)

FOREIGN PATENT DOCUMENTS

CN   1745301      3/2006
CN   101548366    9/2009
(Continued)

OTHER PUBLICATIONS

Chinese Office Action—Chinese Patent Application No. 201610020737.9 dated Aug. 19, 2019, citing references listed herein.
(Continued)

*Primary Examiner* — Nathan T Leong
(74) *Attorney, Agent, or Firm* — Cantor Colburn LLP

(57) ABSTRACT

A conductor includes a plurality of metal nanostructures and an organic material, where a portion of the organic material surrounding each of the metal nanostructures is selectively removed, and the conductor has a haze of less than or equal to about 1.1, a light transmittance of greater than or equal to about 85% at about 550 nm, and a sheet resistance of less than or equal to about 100 Ω/sq. An electronic device includes the conductor, and a method of manufacturing a conductor includes preparing a conductive film including a metal nanostructure and an organic material, and selectively removing the organic material from the conductive film using a cluster ion beam sputtering.

10 Claims, 14 Drawing Sheets

(51) Int. Cl.
*H01L 21/3213* (2006.01)
*H01L 51/00* (2006.01)
*H01B 1/22* (2006.01)
*H01L 51/56* (2006.01)
*B05D 3/00* (2006.01)

(52) U.S. Cl.
CPC ...... *H01L 21/32131* (2013.01); *H01L 51/004* (2013.01); *H01L 51/0023* (2013.01); *H01L 51/0035* (2013.01); *H01L 51/0097* (2013.01); *H01L 51/56* (2013.01); *B05D 2201/02* (2013.01); *H01L 51/0067* (2013.01); *H01L 51/5234* (2013.01)

(56) References Cited

U.S. PATENT DOCUMENTS

| | | | |
|---|---|---|---|
| 6,207,282 | B1 | 3/2001 | Deguchi et al. |
| 6,797,334 | B2* | 9/2004 | Akizuki ............... C07F 17/00 427/523 |
| 6,797,339 | B2 | 9/2004 | Akizuki et al. |
| 8,268,183 | B2 | 9/2012 | Suzuki et al. |
| 8,454,859 | B2 | 6/2013 | Lowenthal et al. |
| 8,481,981 | B2 | 7/2013 | Suzuki et al. |
| 8,647,916 | B2 | 2/2014 | Kim et al. |
| 8,865,027 | B2 | 10/2014 | Alden et al. |
| 9,755,179 | B2 | 9/2017 | Woo et al. |
| 9,899,123 | B2 | 2/2018 | Alden et al. |
| 10,342,900 | B2 | 7/2019 | Svrluga et al. |
| 10,409,155 | B2 | 9/2019 | Kirkpatrick et al. |
| 10,580,549 | B2 | 3/2020 | Alden et al. |
| 10,749,048 | B2 | 8/2020 | Allemand et al. |
| 2003/0040137 | A1 | 2/2003 | Kim et al. |
| 2006/0257638 | A1 | 11/2006 | Glatkowski et al. |
| 2007/0065651 | A1 | 3/2007 | Glatkowski et al. |
| 2007/0074316 | A1* | 3/2007 | Alden ............... B82Y 30/00 257/784 |
| 2008/0076191 | A1 | 3/2008 | Hall et al. |
| 2008/0283799 | A1 | 11/2008 | Alden et al. |
| 2008/0286447 | A1 | 11/2008 | Alden et al. |
| 2010/0080961 | A1 | 4/2010 | Okamura et al. |
| 2010/0230616 | A1* | 9/2010 | Suzuki ............... H01L 21/3065 250/492.3 |
| 2011/0003460 | A1 | 1/2011 | Akiyama et al. |
| 2011/0285019 | A1 | 11/2011 | Alden et al. |
| 2012/0321864 | A1 | 12/2012 | Lowenthal et al. |
| 2014/0202738 | A1 | 7/2014 | Allemand et al. |
| 2014/0356524 | A1 | 12/2014 | Gao et al. |
| 2015/0027755 | A1 | 1/2015 | Tsujimoto et al. |
| 2016/0153092 | A1 | 6/2016 | Lowenthal et al. |
| 2018/0218802 | A1 | 8/2018 | Alden et al. |
| 2019/0279872 | A1 | 9/2019 | Kirkpatrick et al. |
| 2020/0161017 | A1 | 5/2020 | Alden et al. |
| 2021/0028321 | A1 | 1/2021 | Allemand et al. |

FOREIGN PATENT DOCUMENTS

| | | |
|---|---|---|
| CN | 101563759 | 10/2009 |
| CN | 101679097 | 3/2010 |
| CN | 102250506 | 11/2011 |
| CN | 103180030 | 6/2013 |
| CN | 103430241 | 12/2013 |
| CN | 103460304 | 12/2013 |
| EP | 2477230 | 7/2012 |
| KR | 1020100017128 | 2/2010 |
| KR | 101161729 | 6/2012 |
| KR | 1020120128155 | 11/2012 |
| TW | 201435924 | 9/2014 |
| WO | 2007022276 | 2/2007 |
| WO | 2008131304 A1 | 10/2008 |
| WO | 2014116738 | 7/2014 |

OTHER PUBLICATIONS

Yugang Sun et al., Polyol Synthesis of Uniform Silver Nanowires: A Plausible Growth Mechanism and the Supporting Evidence, Nano Letters, (2003), vol. 3, No. 7, pp. 1-6.
Korean Office Action—Korean Patent Application No. 10-2015-0016716 dated Feb. 23, 2021, citing references listed within.
Chinese Office Action—Chinese Patent Application No. 201610020737.9 dated Jul. 30, 2018, citing references listed within.
Extended European Search Report—European Application No. 15193012.0 dated Jul. 7, 2016, citing references listed herein.
Mallikarjuna N. Nadagouda, et al., "Room Temperature Bulk Synthesis of Silver Nanocables Wrapped with Polypyrrole", Macromol. Rapid Commun., vol. 28, (2007), pp. 2106-2111.
Alexander G. Shard, et al., "Argon Cluster Ion Beams for Organic Depth Profiling: Results from a VAMAS Interlaboratory Study", Analytical Chemistry, 2012, vol. 84, pp. 7865-7873.
C. Heck, et al., "ITO surface smoothing with argon cluster ion beam", Nuclear Instruments and Methods in Physics Research Section B, vol. 242, (2006), pp. 140-142.
Dong-Jin Yun, et al., "An electronic structure reinterpretation of the organic semiconductor/electrode interface based on argon gas cluster ion beam sputtering investigations", Journal of Applied Physics, vol. 114, (2013), pp. 1-8.
Gas Cluster Ion Beam System, Copyright 1996-2015, pp. 1-2, Retrieve from the Internet Jun. 15, 2015, <URL:http://www.tel.com/product/spe/mm/index.htm>.
Gas Cluster Ion Beam, Copyright 2013, Retrieved from the Internet Jun. 15, 2015, <URL:http://www.exogenesis.us/platform-technology/gas-cluster-ion-beam>.
Gas cluster ion beam, Modified May 11, 2014, pp. 1-3, Retrieved from the Internet Jun. 12, 2015, <URL:http://en.wikipedia.org/wiki/Gas_cluster_ion_beam>.
Prof. Isao Yamada, "Gas Cluster Ion Beam Equipment", Retrieved from the internet Jun. 29, 2015, <URL:http://www.jst.go.jp/tt/EN/cips_details/pdf_2/4-2.pdf>.
Sukang Bae, et al., "Roll-to-roll production of 30-inch graphene films for transparent electrodes", Nature Nanotechnology, vol. 5, Aug. 2010, pp. 574-578.

* cited by examiner

CONDUCTOR AND METHOD OF MANUFACTURING THE SAME

CROSS-REFERENCE TO RELATED APPLICATIONS

This application is a divisional of U.S. patent application Ser. No. 14/788,780, filed on Jun. 30, 2015, which claims priority to Korean Patent Application No. 10-2015-0016716 filed on Feb. 3, 2015, and all the benefits accruing therefrom under 35 U.S.C. § 119, the content of which in its entirety is herein incorporated by reference.

BACKGROUND

1. Field

Embodiments of the invention relate to a conductor and a method of manufacturing the conductor.

2. Description of the Related Art

An electronic device such as a liquid crystal display ("LCD"), an organic light emitting diode device, and a touch panel screen, includes a transparent conductor as a transparent electrode.

The transparent conductor may be classified according to its material. For example, the transparent conductor may include an organic material-based transparent conductor such as a conductive polymer, an oxide-based transparent conductor such as indium tin oxide ("ITO"), and a metal-based transparent conductor such as a metal grid.

However, the conductive polymer has high resistivity and low transparency, and may be easily degraded when exposed to moisture and air. The ITO may increase the manufacturing cost by using an expensive main element of indium, and may have limited application for a flexible device due to its low flexibility. The metal-based transparent conductor may increase the manufacturing cost since the manufacturing process thereof is complicated.

Recently, as flexible devices have drawn more attention, the material for a transparent electrode of the flexible device has been researched, and for example, may include metal nanostructures such as silver nanowires. The metal nanostructure may be prepared, for example, as an ink composition, and the ink composition may be coated on a substrate and dried to provide a film.

SUMMARY

The metal nanostructure as the material for a transparent electrode may be synthesized in various methods, for example, a method of synthesizing a metal nanostructure using an organic agent such as polyvinyl pyrrolidone ("PVP") has been widely known. In such a method, the synthesized metal nanostructure may be prepared as a metal nanostructure coated with an organic material. However, the organic material coated on the surface of metal nanostructure may remain after being manufactured as a film, so the organic material may block direct contact between the metal nanostructures and may deteriorate electrical characteristics of the film due to high insulating characteristics.

Embodiments of the invention provide a conductor having improved electrical characteristics.

Embodiments of the invention provide a method of manufacturing the conductor.

Embodiments of the invention provide an electronic device including the conductor.

According to an embodiment, a conductor includes a plurality of metal nanostructures and an organic material, where a portion of the organic material surrounding each metal nanostructure is selectively removed, and the conductor has a haze of less than or equal to about 1.1, a light transmittance of greater than or equal to about 85% at about 550 nanometers (nm), and a sheet resistance of less than or equal to about 100 ohms per square ($\Omega$/sq).

In an embodiment, adjacent metal nanostructures may be in direct contact with each other.

In an embodiment, the adjacent metal nanostructures may be physically connected to each other via a junction.

In an embodiment, the metal nanostructure may include a silver nanostructure, and the organic material may include polyvinyl pyrrolidone ("PVP").

According to another embodiment, an electronic device includes the conductor described above.

In an embodiment, the electronic device may include a liquid crystal display ("LCD"), an organic light emitting diode ("OLED") device, a touch screen panel, a solar cell, an optoelectronic device, or a sensor.

In an embodiment, the electronic device may further include a polymer substrate disposed under the conductor, and a chemical composition change between a surface of the polymer substrate overlapping the conductor may and a surface of a polymer substrate not overlapping the conductor may be less than or equal to about 5%.

In an embodiment, the polymer substrate may include a polycarbonate substrate, and a carbon/oxygen ratio difference between the surface of the polymer substrate overlapping the conductor and the surface of the polymer substrate not overlapping the conductor may be less than or equal to about 5%.

According to another embodiment, a method of manufacturing a conductor includes preparing a conductive film including a metal nanostructure and an organic material, and selectively removing the organic material from the conductive film using cluster ion beam sputtering.

In an embodiment, the cluster ion beam sputtering may include a gas cluster ion beam sputtering, C60 cluster ion beam sputtering, a metal cluster ion beam sputtering, or a combination thereof.

In an embodiment, the gas cluster ion beam sputtering may include argon gas cluster ion beam sputtering, nitrogen gas cluster ion beam sputtering, fluorine-containing gas ion beam sputtering, or a combination thereof.

In an embodiment, the selectively removing the organic material may include performing the cluster ion beam sputtering at an acceleration voltage of about 5 electron volts (eV) to about 20 eV.

In an embodiment, the selectively removing the organic material may include performing the cluster ion beam sputtering for about 1 minute (min) to about 60 min.

In an embodiment, the preparing the conductive film may include applying an ink including the metal nanostructure and the organic material on a polymer substrate and drying the polymer substrate on which the ink is applied.

In an embodiment, a surface of the polymer substrate may not be substantially damaged by the cluster ion beam sputtering.

In an embodiment, the surface of the polymer substrate may have a chemical composition change of less than or equal to about 5% before and after using the cluster ion beam sputtering.

In an embodiment, the polymer substrate may include a polycarbonate substrate, and a carbon/oxygen ratio difference between a surface of the polymer substrate overlapping the conductive film and a surface of the polymer substrate not overlapping the conductive film may be less than or equal to about 5%.

In an embodiment, the organic material may include at least one of a portion coated on the surface of the metal nanostructure and a portion disposed among the metal nanostructures.

In an embodiment, the selectively removing the organic material may include measuring how much of the organic material is removed using X-ray photoelectron spectroscopy ("XPS").

In an embodiment, the metal nanostructure may include a silver nanostructure, and the organic material may include PVP.

BRIEF DESCRIPTION OF THE DRAWINGS

These and/or other features of the invention will become apparent and more readily appreciated from the following detailed description of embodiments thereof, taken in conjunction with the accompanying drawings, in which.

DETAILED DESCRIPTION

Figure 1:
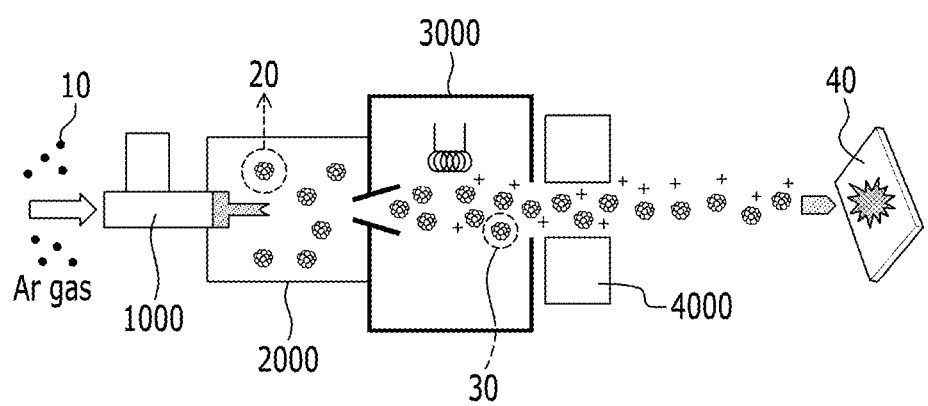
FIG. 1 is a schematic view showing Ar gas cluster ion beam sputtering used as a cluster ion beam sputtering in an embodiment of the method of manufacturing a conductor.

The invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example In an exemplary embodiment, if when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an embodiment of a method of manufacturing a conductor according to the invention will be described.

An embodiment of the method of manufacturing a conductor according to the invention includes preparing a conductive ink including a metal nanostructure, applying the conductive ink to provide a conductive film including a metal nanostructure and an organic material, and selectively removing the organic material using cluster ion beam sputtering.

In such an embodiment, the conductive ink may include a metal nanostructure, a binder, and a solvent.

In such an embodiment, the metal nanostructure is a nano-sized structure including a metal, for example, nanowires, nanotubes, nanoparticles, nanocapsules, nanoplates, nanocubes, and nanospheres having a diameter of several nanometers to several hundreds of nanometers, or a combination thereof. The metal nanostructure may have a diameter of, for example, less than or equal to about 500 nm, for example about 10 nm to about 500 nm, or for example of about 20 nm to about 300 nm.

In such an embodiment, the metal nanostructure may include, for example, a low resistance metal such as silver (Ag) or copper (Cu), and for example, may be a silver nanostructure. The metal nanostructure may be synthesized by growing, for example, a metal seed together with an organic agent under predetermined conditions, and it may be synthesized by, for example, a polyol method using polyvinyl pyrrolidone ("PVP"). Thereby, in the synthesized metal nanostructure, an organic material may be coated on the surface of a nanostructure including a metal.

In one embodiment, for example, the metal nanostructure may be polymer-coated metal nanostructure, and for another example, a PVP-coated metal nanostructure. In one embodiment, for example, the metal nanostructure may be a polymer-coated silver nanostructure, or a polyvinyl pyrrolidone-coated silver nanostructure. In one embodiment, for example, the organic material coating may have a thickness of about 1 nm to about 10 nm, or about 2 nm to about 6 nm, for example.

In an embodiment, an amount of the metal nanostructure may be about 0.01 weight percent (wt %) to about 10 wt % based on the total amount of the conductive ink.

In such an embodiment, the binder is not particularly limited a specific material. In an embodiment, the binder may include a material that has the viscosity of the conductive ink appropriately adjusted, and may enhance the binding force of the metal nanostructure on the substrate. In one embodiment, for example, the binder may be an organic binder. In such an embodiment, the binder may include methylcellulose, ethylcellulose, hydroxypropyl methylcellulose ("HPMC"), hydroxypropyl cellulose ("HPC"), xanthan gum, polyvinyl alcohol ("PVA"), PVP, carboxymethyl cellulose, hydroxyethyl cellulose, or a combination thereof, for example, but is not limited thereto. An amount of the binder may be about 5 to about 50 parts by weight based on 100 parts by weight of the metal nanostructure.

In such an embodiment, the conductive ink may further include a polymer dispersing agent. The polymer dispersing agent may be a polymer having a weight average molecular weight of about 40,000 or less. In one embodiment, for example, the polymer dispersing agent may include a (meth)acrylate compound. In such an embodiment, by using a polymer having the weight average molecular weight of about 40,000 or less, the sheet resistance and haze increase caused by the polymer dispersing agent may be effectively prevented. An amount of the polymer dispersing agent may be in a range of about 0.1 part by weight to about 5 parts by weight based on 100 parts by weight of the metal nanostructure.

The solvent may include a medium capable of dissolving and/or dispersing the metal nanostructure and the binder. In one embodiment, the solvent may be, for example, water. In one alternative embodiment, the solvent may be, for example, a mixture of water and alcohol. In such an embodiment, the alcohol may be, for example, methanol, ethanol, n-propyl alcohol, isopropyl alcohol, n-butanol, isobutanol, t-butanol, propylene glycol, propylene glycol methyl ether, ethylene glycol, or a combination thereof. The solvent may be used in a balance amount other than the above components and other solids.

In an embodiment, the conductive ink is applied on the substrate and dried to provide a conductive film.

In such an embodiment, the substrate may be a glass substrate, a semiconductor substrate or a polymer substrate, or may include a glass substrate, a semiconductor substrate or a polymer substrate laminated with an insulation layer, a semiconductor layer and/or a conductive layer.

In such an embodiment, the conductive ink may be applied on the substrate according to various methods, for example, bar coating, blade coating, slot die coating, inkjet coating, or a combination thereof.

In such an embodiment, the drying may be performed by natural drying, hot-air drying or heat-treating at a temperature of greater than or equal to the boiling point of the solvent.

The conductive film may include the metal nanostructures and a binder. The conductive film may further or selectively include a polymer dispersing agent. The metal nanostructures may be arranged in random without any specific orientation, and each metal nanostructure may contact an adjacent metal nanostructure to provide electrical characteristics.

In an embodiment, as described above, the metal nanostructure may be a metal nanostructure coated with an organic material, for example, a PVP-coated metal nanostructure. In such an embodiment, the conductive film includes the metal nanostructure, an organic material coated on the surface of the metal nanostructure, a binder, and an organic material such as a polymer dispersing agent.

In an embodiment, the organic material included in the conductive film may be selectively removed using cluster ion beam sputtering. In such an embodiment, the organic material surrounding the metal nanostructure in the conductive film exposes the at least a portion of the metal nanostructure. In such an embodiment, the at least a portion of the metal nanostructure is not in contact with the organic material.

In such an embodiment, the cluster ion beam sputtering may selectively etch an organic material using acceleration energy of cluster-forming atoms.

In the cluster ion beam sputtering, as cluster-forming atoms may share acceleration energy, unlike the conventional ion sputtering, the kinetic energy per atom may be decreased in a level lower than or equal to the chemical bonding energy of an organic material. Thus, in such an embodiment where the cluster ion beam sputtering is used, the organic material may be etched while breaking fewer or a substantially low number of chemical bonds of the organic material, and also the inorganic material having a strongly closed structure due to a metallic bond and a covalent bond of atoms is hardly etched, so that the organic material may be selectively etched from a composite including an inorganic material/organic material. Accordingly, in such an embodiment, only the organic material coated on a metal nanostructure may be effectively selectively removed such that at least a portion of the metal nanostructure through the organic material.

In such an embodiment, the cluster ion beam sputtering may include, for example, gas cluster ion beam sputtering ("GCIB sputtering"), C60 cluster ion beam sputtering, metal cluster ion beam sputtering, or a combination thereof. In such an embodiment, the gas cluster ion beam sputtering may use, for example, an inert gas or a fluorine-containing gas, and may be, for example, argon (Ar) gas cluster ion beam sputtering, nitrogen ($N_2$) gas cluster ion beam sputtering, $CF_4$ gas cluster ion beam sputtering, $SF_6$ gas cluster ion beam sputtering, or a combination thereof. In such an embodiment, the metal cluster ion beam sputtering may be, for example, gold (Au) cluster ion beam sputtering.

FIG. 1 is a schematic view showing an Ar gas cluster ion beam sputtering used as the cluster ion beam sputtering in an embodiment of the method of manufacturing a conductor.

Referring to FIG. 1, in the Ar gas cluster ion beam sputtering, Ar gas 10 may be passed through a high-pressure nozzle 1000 and delivered to a first vacuum part 2000 and expanded to provide a neutral Ar cluster 20. The neutral Ar cluster 20 is a cluster in which several hundred to several thousand Ar atoms are aggregated. In the Ar gas cluster ion beam sputtering, the number of neutral Ar clusters 20 may be controlled by adjusting a flow rate and a nozzle pressure of Ar gas 10. The number of the Ar atoms in each neutral Ar cluster 20 may be, for example, from about 1000 to about 4000, but is not limited thereto. The flow rate of Ar gas 10 may be, for example, in a range from about 200 standard cubic centimeter per minute (sccm) to about 600 sccm, and the nozzle gas pressure may be, for example, in a range from about 0.5 megapascal (MPa) to about 0.8 MPa, but are not limited thereto.

Subsequently, the neutral Ar cluster 20 is supplied to a second vacuum part 3000 and ionized by electron bombardment, for example, by an ionizer, to provide an ionized Ar cluster 30 having high energy.

Subsequently, the ionized Ar cluster 30 is passed through an acceleration electrode 4000 and delivered onto the surface of a conductive film 40 to etch an organic material in the conductive film 40. The organic material may include an organic material coated on the surface of a metal nanostructure and/or an organic material disposed among metal nanostructures. In the Ar gas cluster ion beam sputtering, the acceleration voltage and the process time may be adjusted based on a thickness of the conductive film 40 and an amount of the organic material, and for example, the etching may be performed at an acceleration voltage of about 5 electron volts (eV) to about 20 eV for about 1 minute (min) to about 60 min.

An amount of the organic material of conductive film 40 that has been removed by the Ar gas cluster ion beam sputtering may be measured using X-ray photoelectron spectroscopy ("XPS"). The XPS may provide surface information of less than or equal to about 10 nanometers (nm), to effectively measure how much of the organic material of the surface of the metal nanostructure is removed.

In one embodiment, where the conductive film includes a PVP-coated Ag nanostructure, a peak intensity of the chemical bond between Ag and nitrogen (N), which is a component of PVP, is measured to obtain how much of the organic material of the surface of metal nanostructure is removed according to performing the cluster ion beam sputtering. Thus, by removing PVP, the peak intensity of the Ag bond is increased, and the peak intensity of carbon and nitrogen may be decreased or disappear.

In one embodiment, for example, where a device, in which the Ar cluster ion beam and the XPS are associated, is used, the acceleration voltage and the process time may be adjusted while monitoring how much of the organic material is removed in real time.

In the Ar cluster ion beam sputtering, Ar atoms in the ionized Ar cluster 30 may share the acceleration energy as mentioned above, so, for example, when the ionized Ar cluster 30 having energy of several hundred to several thousand kiloelectron volts (keV) is delivered to the conductive film 40, the energy per Ar atom in the ionized Ar cluster 30, which is the energy of several to several hundred keV, may be delivered to the organic material. Thus, the organic material may be etched while reducing damage to chemical bonds of the organic material, and also the metal nanostructure having a structure in which atoms are strongly and closely aggregated by a metallic bond and a covalent bond is hardly etched, to selectively etch organic material without physically and electrically damaging the metal nanostructure.

Figure 2:
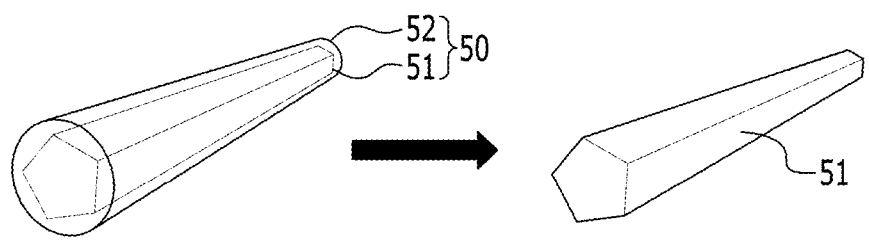
FIG. 2 is a schematic view showing an embodiment of a metal nanostructure in which an organic material is removed by cluster ion beam sputtering.

FIG. 2 is a schematic view showing an embodiment of a metal nanostructure in which the organic material is removed by the cluster ion beam sputtering.

Referring to FIG. 2, in a metal nanostructure 50 existing in the conductive film before performing the cluster ion beam sputtering, a metal nanostructure 51 including or consisting of a metal is coated with an organic material 52. The metal nanostructure 51 may be, for example, an Ag nanostructure, and the organic material 52 may be, for example, PVP. When performing the cluster ion beam sputtering, the organic material 52 of the metal nanostructure 50 is selectively removed to leave only the metal nanostructure 51 including or consisting of a metal.

Accordingly, the organic material 52 surrounding the metal nanostructure 51 is selectively removed to provide the direct contact A of the metal nanostructure 51 with an adjacent nanostructure, such that the electrical characteristics of the conductive film may be improved by removing the organic material having high insulation characteristics.

Figure 3:
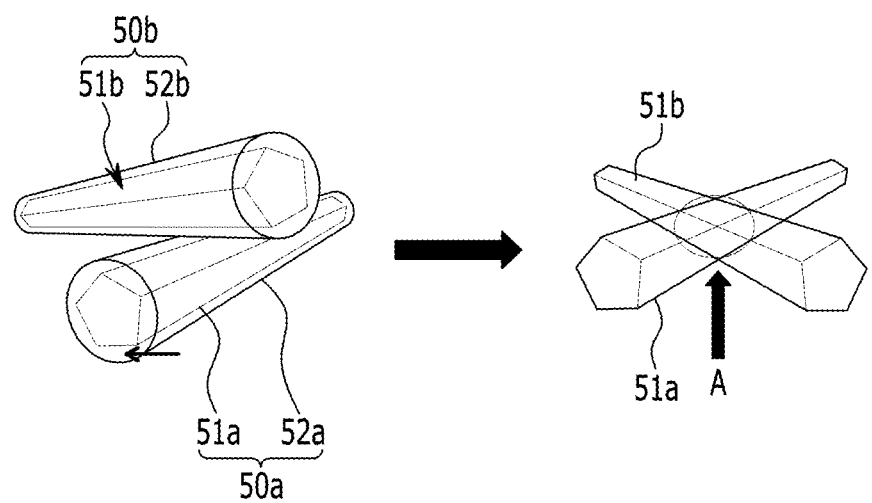
FIG. 3 is a schematic view showing another embodiment of a metal nanostructure in which an organic material is removed by cluster ion beam sputtering.

FIG. 3 is a schematic view showing another embodiment of a metal nanostructure in which an organic material is removed by the cluster ion beam sputtering.

Referring to FIG. 3, in adjacent metal nanostructures 50a and 50b in the conductive film before performing the cluster ion beam sputtering, organic materials 52a and 52b are coated on metal nanostructures 51a and 51b consisting of a metal, respectively. The metal nanostructures 51a and 51b may be, for example, an Ag nanostructure, and the organic material 52a and 52b may be, for example, PVP.

When performing the cluster ion beam sputtering, the organic materials 52a and 52b may be selectively removed from the adjacent metal nanostructures 50a and 50b, to leave only metal nanostructures 51a and 51b including or consisting of a metal. Accordingly, the adjacent metal nanostructures 51a and 51b may be in direct contact with each other without interposing the organic material at a junction A, such that the electrical characteristics of the conductive film may be improved. In such an embodiment, when applying a high acceleration voltage during the cluster ion beam sputtering, the metal nanostructures 51a and 51b may be welded to each other by locally heating at the junction A, such that the electrical characteristics may be further improved, and the optical properties may be improved according to a haze decrease.

In such an embodiment, the cluster ion beam sputtering may selectively remove only the organic material of the conductive film without damaging the substrate disposed under the conductive film, unlike a conventional organic material removing method such as an Ar ion sputtering, an ultraviolet ("UV")-ozone plasma method, a wet etching by a chemical solution, a laser method, or a heat treatment.

In one embodiment, for example, where the substrate is a polymer substrate including a polymer, such as polycarbonate ("PC") or polyethylene terephthalate ("PET"), the chemical bond of the surface of the polymer substrate may not be substantially affected or be effectively maintained even after the cluster ion beam sputtering. In one embodiment, for example, the surface of the polymer substrate may not be substantially damaged so that the surface of the polymer substrate has a chemical composition change of less than or equal to about 5% before and after performing cluster ion beam sputtering. Accordingly, an increase in haze caused by damaging the substrate surface may be effectively prevented, and the optical property of the conductive film may be thereby improved. Such an embodiment of the conductive film may be applied on a polymer substrate to accomplish a flexible electronic device having improved electrical and optical properties.

In addition, the metal nanostructure undergoing the cluster ion beam sputtering may have decreased sheet resistance, decreased haze and enhanced light transmittance after performing the cluster ion beam sputtering. In one embodiment, for example, the metal nanostructure may a decreased sheet resistance by about 20% to 80%, a decreased haze by about 10% to about 50%, and an improved light transmittance by about 0.1% to about 3%, after performing the cluster ion beam sputtering.

In such an embodiment, after performing the cluster ion beam sputtering, the resistance change of the metal nanostructure according to a lapse of time is decreased, so that the electrical stability of the conductive film may be enhanced.

An embodiment of the conductive film may be, for example, a transparent conductor, and may simultaneously have a haze of about 1.10 or less, a light transmittance of about 85% or more, and a sheet resistance of about 100 ohms per square ($\Omega$/sq) or less. In such an embodiment of the conductive film, the haze may be, for example, in a range of about 0.50 to about 1.10, or in a range of about 0.70 to about 1.10. In such an embodiment of the conductive film, the light transmittance may be, for example, in a range of about 85 to about 100%, or in a range of about 90 to about 100%. In such an embodiment of the conductive film, the sheet resistance may be, for example, in a range of about 30 $\Omega$/sq to about 100 $\Omega$/sq, or in a range of about 30 $\Omega$/sq to about 95 $\Omega$/sq. An embodiment of the conductive film having a haze of about 1.10 or less, a light transmittance of about 85% or more, and a sheet resistance of about 100 $\Omega$/sq or less may be effectively used as a transparent electrode.

The transparent conductor may be applied as a transparent electrode of various electronic devices. The electronic devices may be, for example, a flat panel display such as a liquid crystal display ("LCD"), or an organic light emitting diode ("OLED") device, a touch panel screen, a solar cell, an e-window, a heat mirror, or a transparent transistor, but are not limited thereto. Such an embodiment of the conductive film is a thin film including the metal nanostructure and having a high flexibility, and thus may be applied to a flexible electronic device.

Hereinafter, an embodiment of the electronic device, e.g., an embodiment of an organic light emitting diode device including the conductive film as a transparent electrode, will be described referring to FIG. 4.

Figure 4:
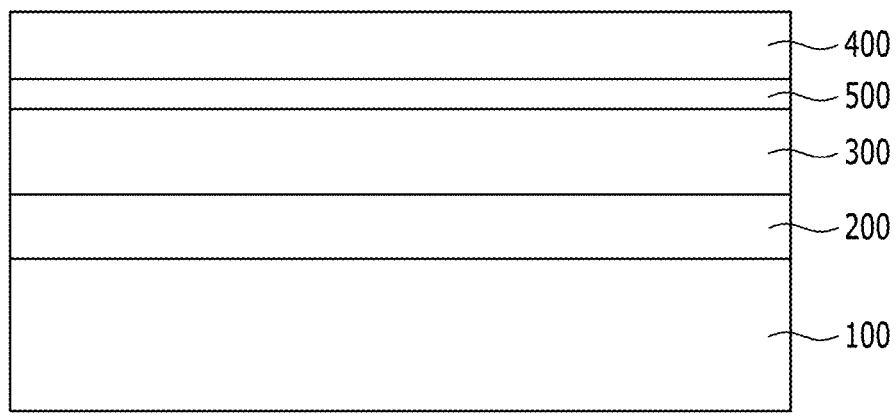
FIG. 4 is a schematic cross-sectional view of an embodiment of an organic light emitting diode ("OLED") device according to the invention.

FIG. 4 is a schematic cross-sectional view of an embodiment of an OLED device according to the invention.

Referring to FIG. 4, an embodiment of the OLED device includes a substrate 100, a lower electrode 200, an upper electrode 400 disposed opposite to or facing the lower electrode 200, and an emission layer 300 interposed between the lower electrode 200 and the upper electrode 400.

The substrate 100 may include, for example, a glass substrate, a polymer substrate, or a silicon substrate. In an embodiment, where the substrate 100 includes the polymer substrate, the polymer substrate may include, for example, PC, polymethylmethacrylate, PET, polyethylene naphthalate, polyamide, polyethersulfone, or a combination thereof, and the polymer substrate may be flexible to be applied to a flexible device.

One of the lower electrode 200 and the upper electrode 400 is a cathode, and the other of the lower electrode 200 and the upper electrode 400 is an anode. In one embodiment, for example, the lower electrode 200 may be an anode and the upper electrode 400 may be a cathode.

In such an embodiment, at least one of the lower electrode 200 and the upper electrode 400 is transparent. In an embodiment, where the lower electrode 200 is transparent, an OLED device may have a bottom emission structure in which light is emitted toward the substrate 100. In an embodiment, where the upper electrode 400 is transparent, the OLED device may have a top emission structure in which a light is emitted away from the substrate 100. In an embodiment, where the lower electrode 200 and upper electrode 400 are both transparent, light may be emitted toward the substrate 100 and away from the substrate 100 at both sides.

As described above, the transparent electrode may be formed by using the conductive ink including a metal nanostructure and an organic material, and by removing the organic material using a cluster ion beam sputtering. Such a transparent electrode is substantially the same as that described above, and any repetitive detailed description thereof will be omitted.

The emission layer 300 may include an organic material that emits light having one of primary colors such as red, green and blue, or a mixture of an inorganic material with the organic material, for example, a polyfluorene derivative, a (poly)paraphenylene vinylene derivative, a polyphenylene derivative, a polyfluorene derivative, polyvinylcarbazole, a polythiophene derivative, or a compound prepared by doping the polymer materials above with a perylene-based pigment, a coumarin-based pigment, a rothermine-based pigment, rubrene, perylene, 9,10-diphenylanthracene, tetraphenyl butadiene, Nile red, coumarin, quinacridone, and the like. An OLED device may display a desirable image by a spatial combination of primary colors displayed based on the light emitted by an emission layer therein.

The emission layer 300 may emit white light by combining lights of three primary colors such as red, green and blue. Herein, the emission layer 300 may emit white light by combining colors of neighboring sub-pixels or by combining laminated colors in a vertical direction.

An auxiliary layer 500 may be positioned between the emission layer 300 and the upper electrode 400 to improve luminous efficiency. In an embodiment, as shown in FIG. 4, the auxiliary layer 500 may be disposed between the emission layer 300 and the upper electrode 400, but is not limited thereto. In an alternative embodiment, the auxiliary layer 500 may be disposed between the emission layer 300 and the lower electrode 200, between the emission layer 300 and the upper electrode 400, or between the emission layer 300 and the lower electrode 200.

In an embodiment, the auxiliary layer 500 may include an electron transport layer ("ETL") and a hole transport layer ("HTL") for balancing between electrons and holes, an electron injection layer ("EIL") and a hole injection layer ("HIL") for reinforcing injection of electrons and holes, and the like. In an embodiment, the auxiliary layer 500 may include one or more layers described above. In an alternative embodiment, the auxiliary layer 500 may be omitted.

Herein, the OLED device including the transparent electrode is described. However, the embodiments are not limited thereto, and the transparent electrode may be applied to any electronic device including a transparent electrode. Such an embodiment of the transparent electrode may be used as a pixel electrode and/or a common electrode of an LCD, a display electrode of a plasma display device, or a transparent electrode of a touch panel device, a transparent electrode of a solar cell, a transparent electrode of an optoelectronic device, a transparent electrode of a sensor, and the like, for example.

Hereinafter, embodiments of the invention will be described in greater detail with reference to examples. Embodiments of the invention will not be limited to these examples, which are not in any sense to be interpreted as limiting the scope of the disclosure.

Preparation of Conductive Ink

Preparation Example 1

A conductive ink including 0.384 g of an aqueous solution including 1.3 wt % of PVP-coated Ag nanowires, 0.5 g of a 0.25 wt % hydroxypropyl methyl cellulose ("HPMC") (H7509, manufactured by Sigma) aqueous solution, water, and isopropyl alcohol is prepared. The total amount of water and the amount of the isopropyl alcohol included in the composition have a weight ratio of about 79.2:21.8. That is, the weight ratio of the total amount of water to the amount of the isopropyl alcohol in the composition is about 79.2/21.8.

Manufacture of Conductive Film

Example 1

The conductive ink obtained from Preparation Example 1 is coated on an area of 5×5 mm$^2$ of a PC substrate using a bar coater at a rate of 30 mm/s and dried with hot air at 85° C. for 2 min to provide a conductive film. Then the conductive film is measured for initial sheet resistance and initial transparency.

Subsequently, the substrate including the conductive film thereon is disposed on Fusion™ 500 Series equipment (manufactured by TEL EPION INC.) and undergoes Ar cluster ion beam sputtering. The Ar cluster ion beam sputtering is performed at an acceleration voltage of 5 kilovolts (kV) for 16 min while Ar gas is supplied under a gas pressure of 0.9 megapascal (MPa) while fixing the nozzle pressure at 0.65 MPa.

Example 2

A conductive film is obtained in accordance with the same procedure as in Example 1, except that the Ar cluster ion beam sputtering is performed at an acceleration voltage of 10 kV for 16 min.

Example 3

A conductive film is obtained in accordance with the same procedure as in Example 1, except that the Ar cluster ion beam sputtering is performed at an acceleration voltage of 10 kV for 32 min.

Example 4

A conductive film is obtained by changing the Ar cluster ion beam sputtering time from zero minute (0 min) to 40 min at an acceleration voltage of 10 kV.

Example 5

The conductive ink obtained from Preparation Example 1 is coated on an area of 200×200 μm$^2$ of a PC substrate using a bar coater at a speed of 30 mm/s and then dried with hot air at 85° C. for 2 min to provide a conductive film.

Subsequently, the substrate formed with the conductive film is disposed on Nano TOF-SIMS (manufactured by ULVAC-PHI) and undergoes C60 cluster ion beam sputtering. The C60 cluster ion beam sputtering is performed for 5 min to 20 min under the conditions of an ion beam current of 2 nanoampere (nA) and an acceleration voltage of 20 keV while forming C60+ ions from the C60 target.

Comparative Example 1

A conductive film is obtained in accordance with the same procedure as in Example 1, except that the Ar cluster ion beam sputtering is not performed.

Comparative Example 2

A conductive film is obtained in accordance with the same procedure as in Example 1, except that Ar ion sputtering (Versaprobe, ULVAC-PHI) is performed at 50 watts (W) for 1 min instead of the Ar cluster ion beam sputtering.

Comparative Example 3

A conductive film is obtained in accordance with the same procedure as in Example 1, except that a visible light-ultraviolet ("UV") treatment (UV treatment, primary wavelengths: ~254 nm, 184 nm) is performed for 30 min instead of the Ar cluster ion beam sputtering.

Evaluation

Evaluation 1

The conductive films obtained from Examples 1 and 2 and Comparative Example 1 are measured using transmission electron microscopy ("TEM").

Figure 5:
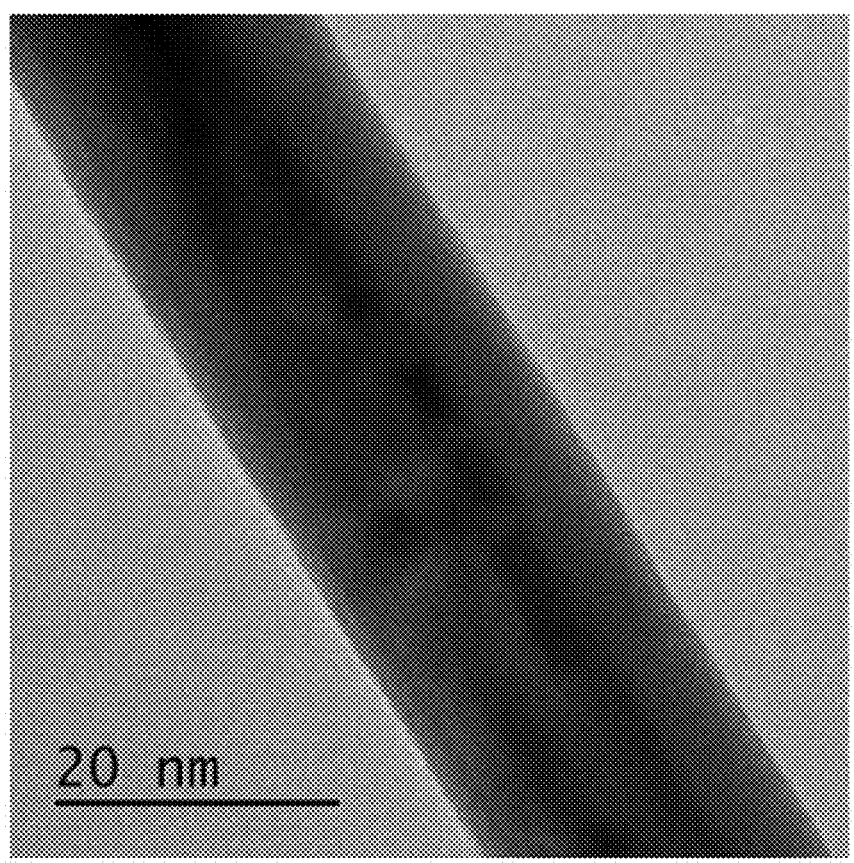
FIG. 5 is a transmission electron microscopy ("TEM") image showing silver nanowire of the conductive film according to Example 1.
Figure 6:
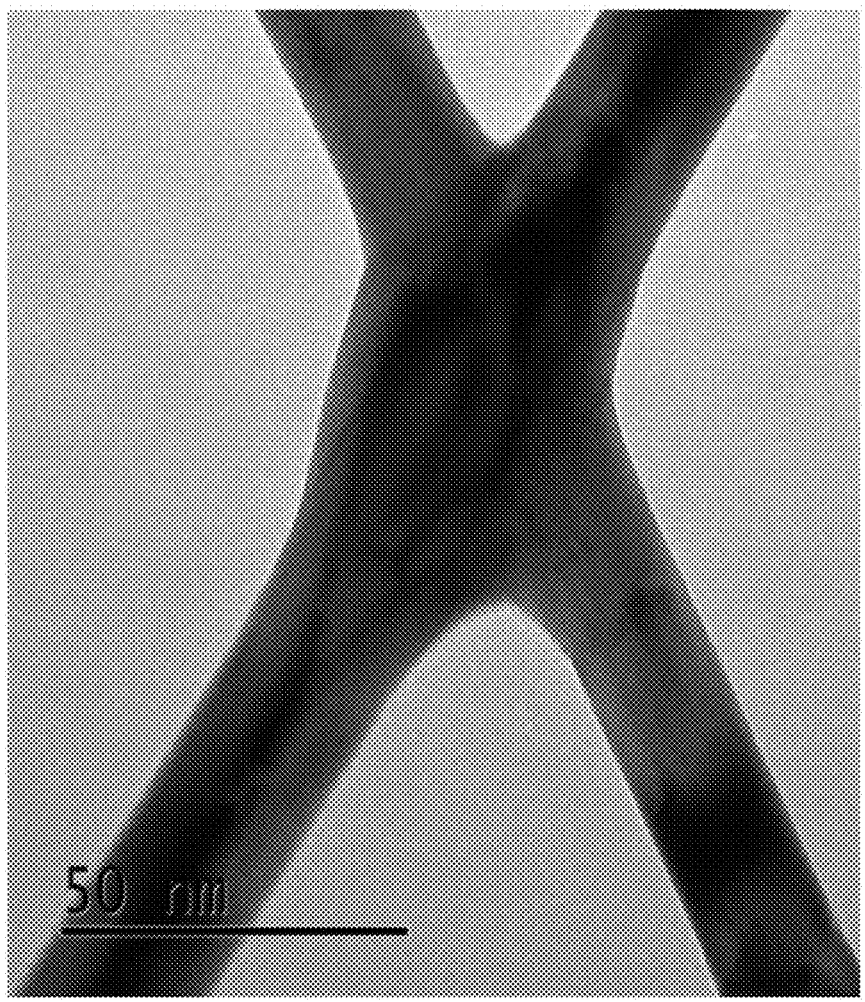
FIG. 6 is a TEM image showing silver nanowire of the conductive film according to Example 2.

FIG. 5 is a TEM image showing Ag nanowire of the conductive film according to Example 1; FIG. 6 is a TEM image showing Ag nanowire of the conductive film according to Example 2; and FIG. 7 is a TEM image showing Ag nanowire of the conductive film according to Comparative Example 1.

Figure 7:
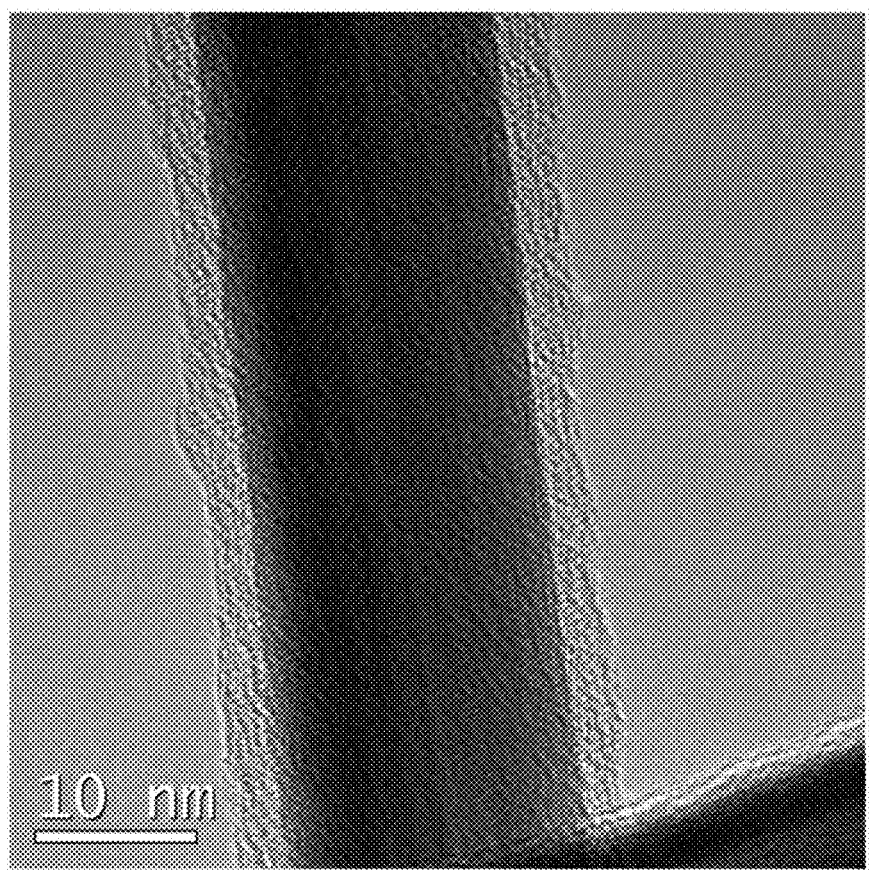
FIG. 7 is a TEM image showing silver nanowire of the conductive film according to Comparative Example 1.

As shown in FIG. 7, the conductive film which does not undergo the Ar cluster ion beam sputtering may have a 4 nm-thick organic material covered on the surface of silver nanowire.

On the other hand, as shown in FIGS. 5 and 6, the organic material is removed from the surface of Ar nanowire in the conductive film undergoing the Ar cluster ion beam sputtering. Particularly, FIG. 6 shows that the adjacent silver nanowires are welded at the junction part and that the organic material is removed from the surface of the Ag nanowire.

Evaluation 2

The conductive film according to Example 5 is measured using an atomic force microscope.

Figure 8:
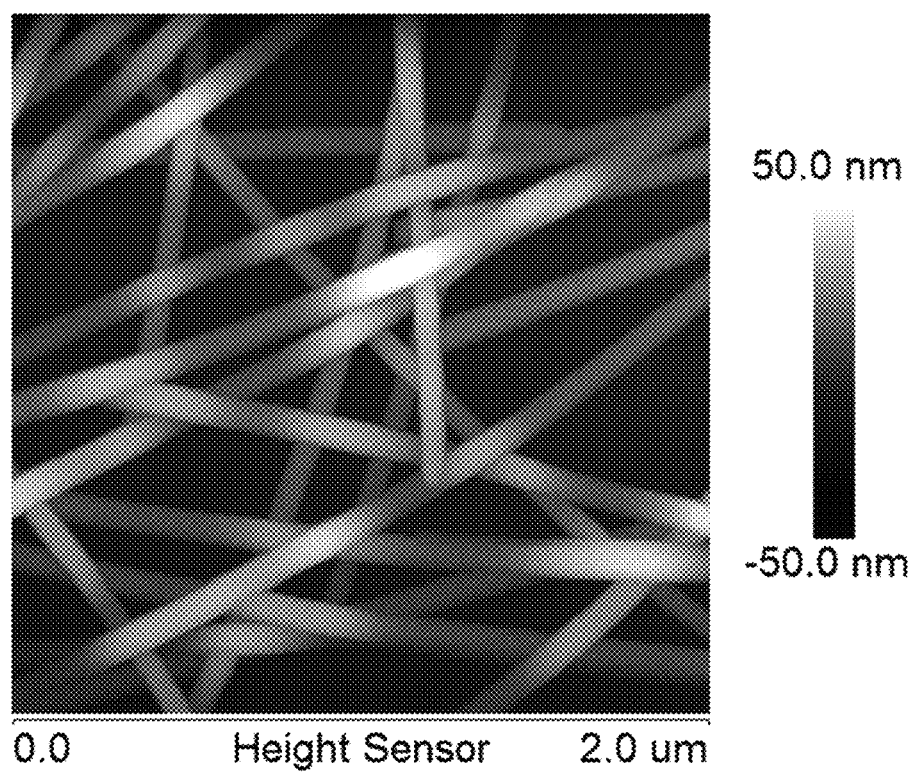
FIG. 8 is an atomic force microscopy ("AFM") image showing silver nanowire of the conductive film according to Example 5.

FIG. 8 is an atomic force microscopy ("AFM") image showing Ag nanowire of the conductive film according to Example 5.

FIG. 8 shows that the organic material is removed from the surface of the Ag nanowire in the conductive film undergoing the C60 cluster ion beam sputtering.

Evaluation 3

The component profile of the conductive films according to Examples 1, 2, and 5 is analyzed depending upon the cluster ion beam sputtering time.

Figure 9:
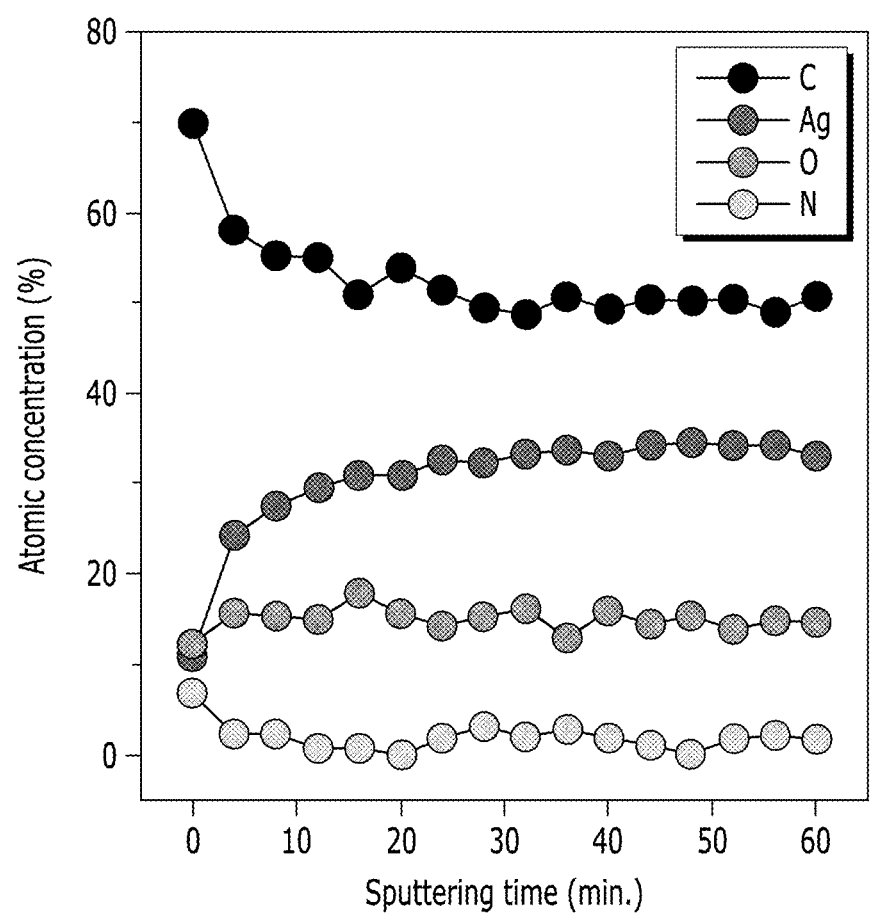
FIG. 9 is an X-ray photoelectron spectroscopic graph of the conductive film according to Example 1 depending upon an Ar cluster ion beam sputtering time.
Figure 10:
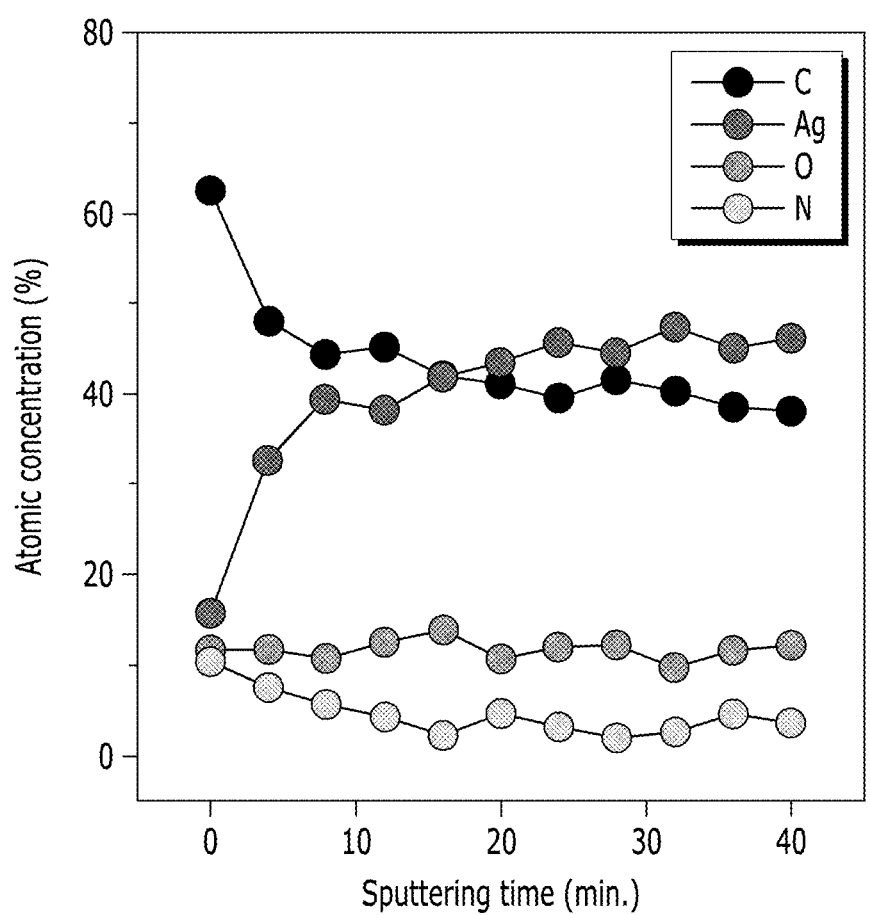
FIG. 10 is an X-ray photoelectron spectroscopic graph of the conductive film according to Example 2 depending upon an Ar cluster ion beam sputtering time.

FIG. 9 is an X-ray photoelectron spectroscopic graph of the conductive film according to Example 1 depending upon the Ar cluster ion beam sputtering time; FIG. 10 is an X-ray photoelectron spectroscopic graph of the conductive film according to Example 2 depending upon the Ar cluster ion beam sputtering time; and FIG. 11 is an X-ray photoelectron spectroscopic graph of the conductive film according to Example 5 depending upon the C60 cluster ion beam sputtering time.

Figure 11:
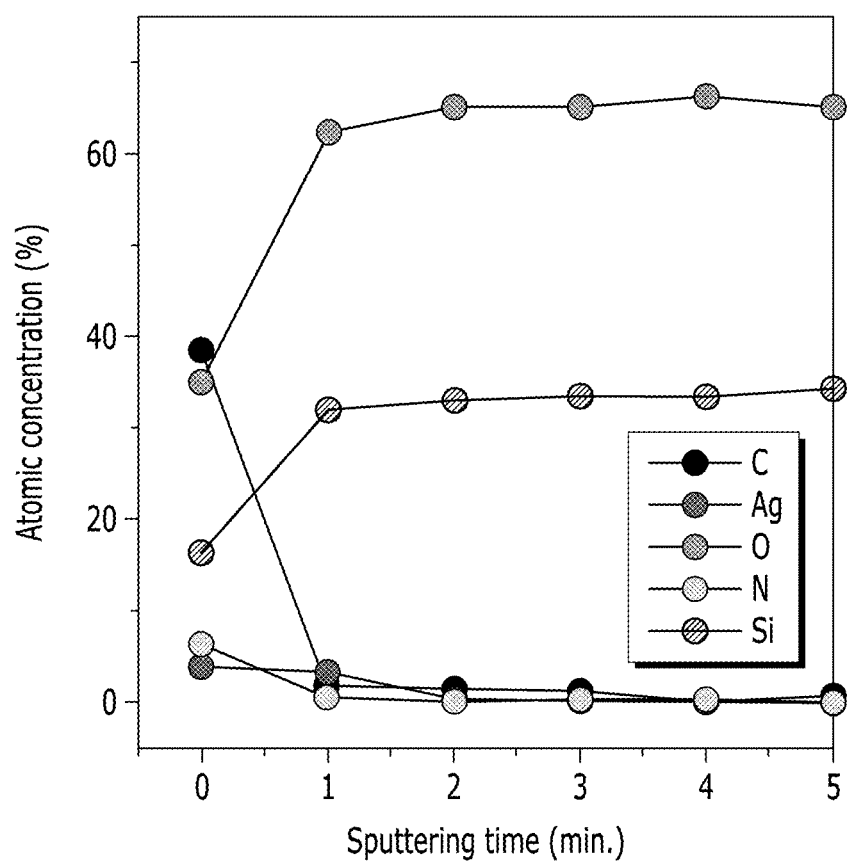
FIG. 11 is an X-ray photoelectron spectroscopy ("XPS") graph of the conductive film according to Example 5 depending upon a C60 cluster ion beam sputtering time.

FIGS. 9 to 11 show that the conductive films according to Examples 1, 2, and 5 have substantially constant Ag compositions according to performing the cluster ion beam sputtering. Accordingly, as shown in FIGS. 9 to 11, the organic material is removed by the cluster ion beam sputtering, and that the Ag nanowire itself is not damaged.

In FIGS. 9 and 10, as the points of constantly maintaining Ag composition are different at about 35% and about 45%, it is assumed to be because the Ag welding density is increased by increasing the welding of Ag nanowire as the acceleration voltage is higher.

Evaluation 4

The conductive film according to Example 4 is evaluated for sheet resistance and haze change depending upon the cluster ion beam sputtering time.

The sheet resistance is measured 18 times using a 4-point measurer (RCHCK, EDTM) and averaged; and the haze is measured 6 times using NDH7000SP (NDK) and averaged.

Figure 12:
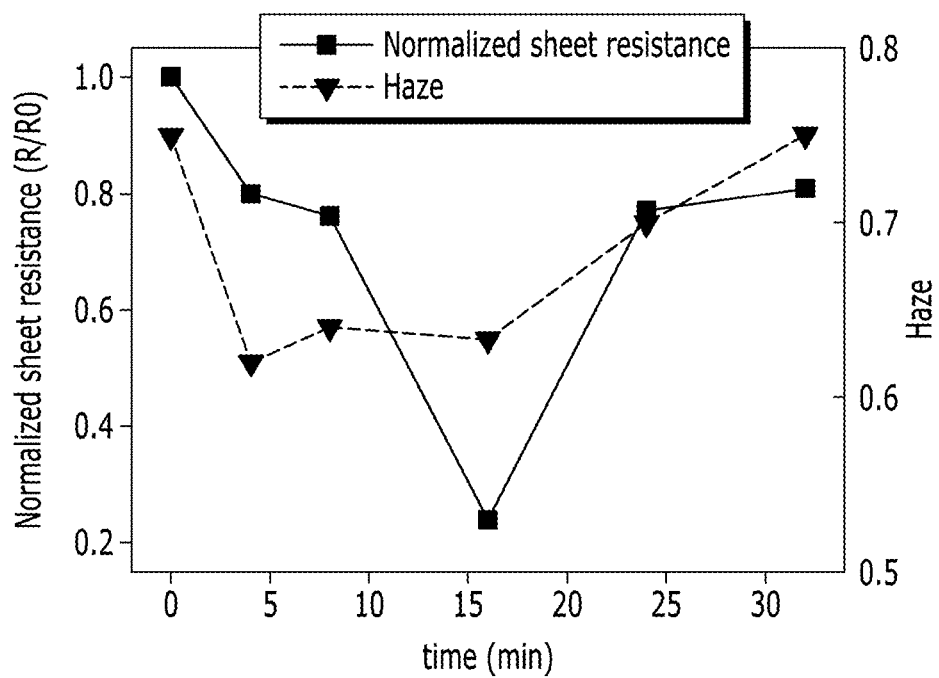
FIG. 12 is a graph showing sheet resistance and a haze change of the conductive film depending upon the Ar cluster ion beam sputtering time.

FIG. 12 is a graph showing the sheet resistance and haze changes of the conductive film obtained from Example 4 according to the Ar cluster ion beam sputtering time.

FIG. 12 shows that the sheet resistance and the haze are decreased by performing the Ar cluster ion beam sputtering, and the sheet resistance and the haze have the lowest points.

Evaluation 5

The conductive films according to Examples 1 to 3 and Comparative Examples 2 and 3 are evaluated for sheet resistance, the transmittance, and haze.

The sheet resistance is repeatedly measured 18 times using a 4-point measurer (RCHCK, EDTM) and averaged; and the transmittance and the haze are repeatedly measured 6 times using NDH7000SP (NDK) and averaged.

The results are shown in Table 1.

TABLE 1

| | Sheet resistance (Ω/sq.) | | Light transmittance (%) | | Haze (%) | |
| --- | --- | --- | --- | --- | --- | --- |
| | Before treatment | After treatment | Before treatment | After treatment | Before treatment | After treatment |
| Example 1 | 148 | 94 | 88.89 | 88.92 | 1 | 0.64 |
| Example 2 | 90.5 | 25.0 | 89.0 | 89.5 | 1 | 0.82 |
| Example 3 | 74 | 52 | 88.6 | 88.9 | 1 | 0.92 |
| Comparative Example 2 | 86 | >1 MΩ | 89.0 | 89.24 | 1 | 0.67 |
| Comparative Example 3 | 93.5 | 152 | 89.0 | 86.9 | 1 | 0.75 |

As shown in Table 1, the sheet resistance and the haze are decreased, and the transmittance is increased, in the conductive films according to Examples 1 to 3 after the Ar cluster ion beam sputtering. On the contrary, in the conductive films according to Comparative Examples 2 and 3, in which the Ar ion sputtering or the visible light-UV treatment is performed instead of the Ar cluster ion beam sputtering, the sheet resistance is significantly increased after performing the Ar ion sputtering or visible light-UV treatment.

Evaluation 6

The conductive films according to Examples 2 and 3 and Comparative Example 1 are compared for the sheet resistance change depending upon the lapse of time.

The conductive films are allowed to stand for 40 days under air (temperature of about 20° C., relative humidity of about 50%), and monitored for sheet resistance change per day of being allowed to stand.

Figure 13:
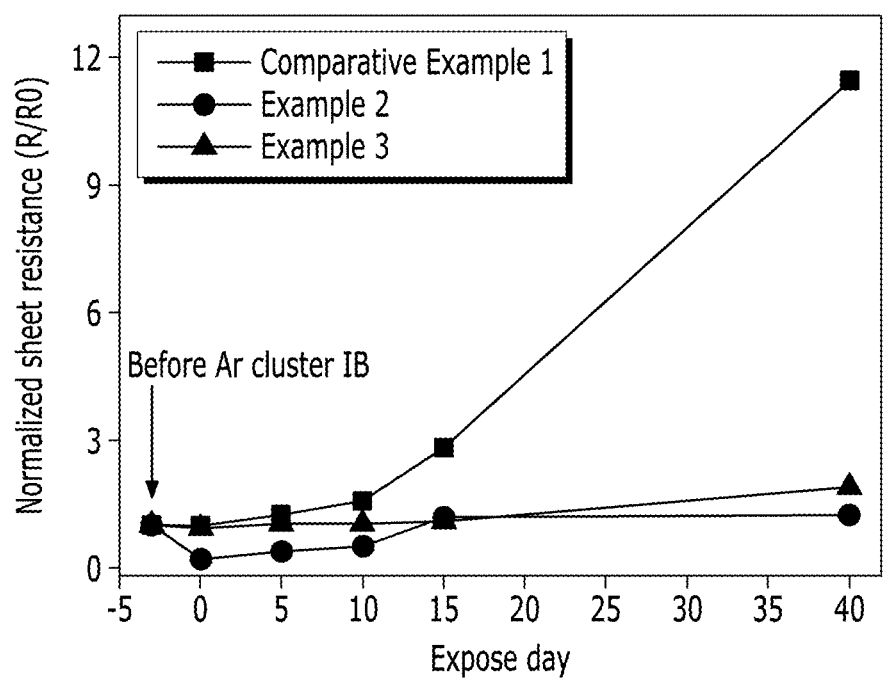
FIG. 13 is a graph comparing a sheet resistance change of the conductive films according to Examples 2 and 3 and Comparative Example 1 depending upon the time.

FIG. 13 is a graph comparing the sheet resistance changes of the conductive films according to Examples 2 and 3 and Comparative Example 1 depending upon the time.

FIG. 13 shows that the conductive films according to Examples 2 and 3 have smaller sheet resistance increase margins even if exposed for a long time when compared with the conductive film according to Comparative Example 1.

Evaluation 7

It is determined whether the PC substrate is damaged by the cluster ion beam sputtering.

The chemical bond of the substrate surface is measured using XPS to determine whether the substrate is damaged or not.

Figure 14:
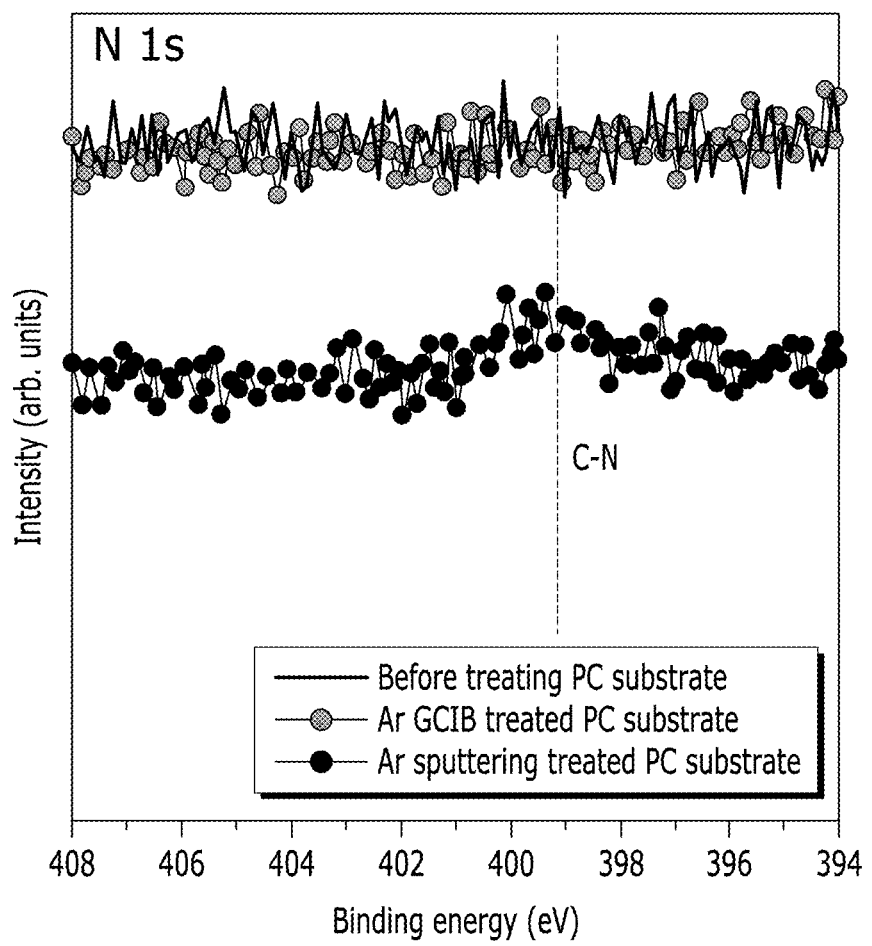
FIG. 14 and FIG. 15 are photoelectron spectrometric graphs showing the chemical bond of the surface of the polycarbonate substrate before and after the Ar cluster ion beam sputtering of Example 2 and before and after the Ar sputtering of Comparative Example 2.
Figure 15:
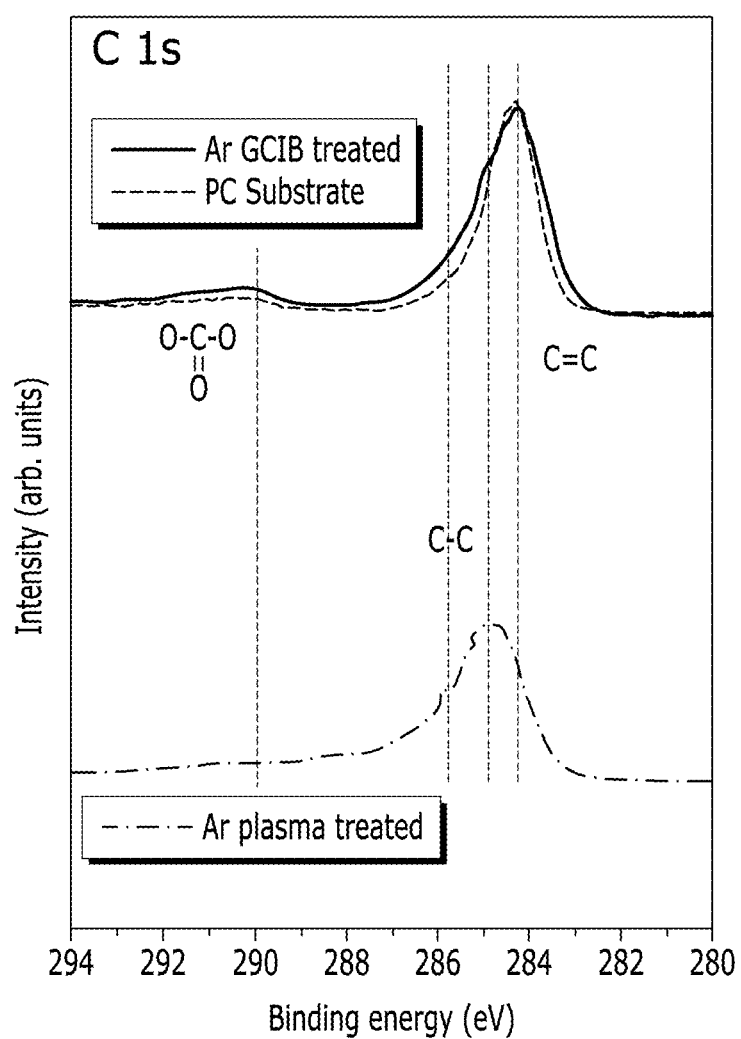

FIG. 14 and FIG. 15 are respectively photoelectron spectroscopic graphs showing the chemical bonds of the PC substrate surface before and after performing the Ar cluster ion beam sputtering according to Example 2, and before and after performing the Ar sputtering according to Comparative Example 2.

FIG. 14 and FIG. 15 show that the PC substrate surface has substantially the same chemical bonds before and after performing the Ar cluster ion beam sputtering according to Example 2. On the other hand, as shown in FIG. 15, the PC substrate surface has changes in the chemical bonds when performing the Ar sputtering according to Comparative Example 2. Thus, FIGS. 14 and 15 show that the PC substrate surface after performing the Ar cluster ion beam sputtering according to Example 2 is substantially not damaged, but the Ar sputtering according to Comparative Example 2 damages the PC substrate surface.

In addition, referring to Table 2, it is shown that after treating the Ar cluster ion beam according to Example 2 and the C60 cluster ion beam according to Example 4, a nitrogen (N) component for PVP is rarely detected in the PC substrate surface, and simultaneously, the carbon/oxygen ratio difference is less than or equal to about 5% compared to the PC substrate. On the other hand, the nitrogen component is more detected in the surface of the PC substrate used in Comparative Example 1 not undergone any treatment; and the carbon/oxygen ratio is significantly increased in the PC substrate used in Comparative Example 2 treated with the Ar plasma, so it is confirmed that the PC substrate is damaged.

While the disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a conductor, the method comprising:
   preparing a conductive film by applying an ink comprising a metal nanostructure, a binder and a solvent on a substrate, and drying the substrate on which the ink is applied, wherein the metal nanostructure comprises a nanostructure including a metal and an organic material coated on a surface of the nanostructure; and
   selectively removing the organic material coated on the surface of the nanostructure in the metal nanostructure on the substrate using a cluster ion beam sputtering.

2. The method of claim 1, wherein the cluster ion beam sputtering comprises a gas cluster ion beam sputtering, C60 cluster ion beam sputtering, a metal cluster ion beam sputtering or a combination thereof.

3. The method of claim 2, wherein the gas cluster ion beam sputtering comprises argon gas cluster ion beam sputtering, nitrogen gas cluster ion beam sputtering, fluorine-containing gas ion beam sputtering, or a combination thereof.

4. The method of claim 1, wherein the selectively removing the organic material comprises performing the cluster ion beam sputtering at an acceleration voltage of about 5 electron volts to about 20 electron volts.

5. The method of claim 4, wherein the selectively removing the organic material comprises performing the cluster ion beam sputtering for about 1 minute to about 60 minutes.

6. The method of claim 1, wherein
   the substrate is a polymer substrate, and
   a surface of the polymer substrate is not substantially damaged by the cluster ion beam sputtering.

7. The method of claim 6, wherein the surface of the polymer substrate has a chemical composition change of less than or equal to about 5% before and after using the cluster ion beam sputtering.

8. The method of claim 7, wherein
   the polymer substrate comprises a polycarbonate substrate, and
   a carbon/oxygen ratio difference between a surface of the polymer substrate overlapping the conductive film has

TABLE 2

|  |  | Carbon | Nitrogen | Oxygen | Silver | Carbon/oxygen ratio |
|---|---|---|---|---|---|---|
| Comparative Example 1 | Ag nanostructure/ PC substrate | 79.18 | 6.19 | 11.42 | 3.21 | 14.4 |
| Comparative Example 2 | Ar plasma-treated Ag nanostructure/ PC substrate | 72.38 | 0.35 | 22.04 | 5.23 | 30.4 |
| Example 4 | C60 cluster ion beam sputtering-treated Ag nanostructure/ PC substrate | 84.97 | 0.89 | 9.79 | 4.34 | 11.5 |
| Example 2 | Ar gas cluster ion beam-treated Ag nanostructure/ PC substrate | 82.06 | 0 | 11.47 | 6.48 | 14.0 |
| Ref. | PC substrate | 91.13 |  | 8.87 |  | 9.73 | and a surface of the polymer substrate not overlapping the conductive film is less than or equal to about 5%.

9. The method of claim 1, wherein the selectively removing the organic material comprises measuring how much of the organic material is removed using X-ray photoelectron spectroscopy.

10. The method of claim 1, wherein
the metal nanostructure comprises a silver nanostructure, and
the organic material comprises polyvinyl pyrrolidone.

* * * * *